(12) United States Patent
Koike

(10) Patent No.: US 8,183,147 B2
(45) Date of Patent: May 22, 2012

(54) METHOD OF FABRICATING A CONDUCTIVE POST ON AN ELECTRODE

(75) Inventor: Osamu Koike, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 0 days.

(21) Appl. No.: 12/929,749

(22) Filed: Feb. 14, 2011

(65) Prior Publication Data

US 2011/0198748 A1  Aug. 18, 2011

(30) Foreign Application Priority Data

Feb. 15, 2010 (JP) ................................. 2010-030277

(51) Int. Cl.
*H01L 21/4763* (2006.01)
*H01L 23/48* (2006.01)

(52) U.S. Cl. ........ 438/620; 438/629; 438/667; 257/774; 257/786; 257/E23.011; 257/E23.145

(58) Field of Classification Search .................. None
See application file for complete search history.

(56) References Cited

U.S. PATENT DOCUMENTS

| | | | |
|---|---|---|---|
| 6,197,613 B1 * | 3/2001 | Kung et al. | 438/106 |
| 6,251,694 B1 * | 6/2001 | Liu et al. | 438/14 |
| 6,818,545 B2 * | 11/2004 | Lee et al. | 438/614 |
| 2007/0052095 A1 * | 3/2007 | Torii et al. | 257/737 |
| 2008/0258305 A1 * | 10/2008 | Lee et al. | 257/758 |
| 2009/0108453 A1 * | 4/2009 | Lin et al. | 257/758 |

FOREIGN PATENT DOCUMENTS

JP  2008-021849 A  1/2008

* cited by examiner

*Primary Examiner* — Alonzo Chambliss
(74) *Attorney, Agent, or Firm* — Rabin & Berdo, P.C.

(57) ABSTRACT

A method of fabricating a semiconductor device includes: forming a semiconductor chip portion having an electrode on a main surface of a wafer; forming a first resist pattern having a first opening on the electrode; filling the first opening with a first electrically conductive material, thereby forming an electrically conductive post; removing the first resist pattern after said forming of the electrically conductive post; forming an interlayer dielectric film having a second opening positioned on the electrically conductive post; and forming an electrically conductive redistribution layer extending from an upper surface of the electrically conductive post over an upper surface of the interlayer dielectric film.

10 Claims, 14 Drawing Sheets

METHOD OF FABRICATING A CONDUCTIVE POST ON AN ELECTRODE

BACKGROUND OF THE INVENTION

1. Field of the Invention

The present invention relates to a semiconductor device such as a large scale integrated circuit and a method for fabricating the same, and more particularly, to a semiconductor device fabricated using wafer-level chip-scale packaging technology and a method for fabricating the same.

2. Description of the Related Art

In recent years, electronic devices such as handheld devices or digital cameras have been reduced in size. This leads to a strong demand for reducing the size of each of semiconductor chips used for the electronic devices, which are mounted on boards such as a circuit board and an interposer, in order to achieve a high packaging density on the board. Wafer-level chip-scale packaging technology (hereinafter also referred to as "W-CSP") has been used to achieve high packaging density. The W-CSP is the technology of packaging an integrated circuit at wafer level before singulating a wafer into individual dies, thus enabling the package size to be practically of the same as the die. A W-CSP structure includes metal interconnects and electrode terminals (e.g., solder bumps or solder coats) for external connection. Each metal interconnect extends from one of electrode pads formed on a wafer by wafer processing, to one of the electrode terminals. The metal interconnects are typically formed on patterned metal seed layers by electroplating. This step of forming the metal interconnects is called the pad redistribution. The pad redistribution enables the increase of the distance between the centers of adjacent electrode terminals formed at the outer side of the W-CSP structure without difficulty, thereby reducing the wiring density of the board on which the W-CSP structure is mounted. The W-CSP is disclosed in, for example, Japanese Patent Application Publication No. 2008-021849.

Before the pad redistribution in a fabrication process using the W-CSP, a wafer inspection may be performed using a probe machine (also referred to as "a prober") that includes probe needles. Specifically, before the wafer inspection and its subsequent pad redistribution, wafer processing is employed to form, on a single wafer, semiconductor integrated circuits having electrode pads on their outer surfaces. The prober can be used to measure the electric characteristics of the semiconductor integrated circuits using the probe needles whose tips are brought in contact with the exposed surfaces of the electrode pads, thereby to determine whether the semiconductor integrated circuits are good or bad for wafer sort. The wafer inspection, however, may create residues (e.g., debris from the electrode pads) remaining on the electrode pads by bringing the probe needles in contact with the electrode pads. The residues may lead to cracks in dielectric films formed on the electrode pads in the pad redistribution step. The cracks may cause any damage such as short-circuiting to semiconductor chips.

SUMMARY OF THE INVENTION

In view of the foregoing, it is an object of the present invention to provide a semiconductor device having good electric characteristics even if the wafer inspection using a probe machine is employed, and a method for fabricating the same.

According to an aspect of the present invention, a method of fabricating a semiconductor device is provided. The method includes: forming a semiconductor chip portion having an electrode on a main surface of a wafer; forming a first resist pattern having a first opening on the electrode; filling the first opening with a first electrically conductive material, thereby forming an electrically conductive post; removing the first resist pattern after said forming of the electrically conductive post; forming an interlayer dielectric film having a second opening positioned on the electrically conductive post; and forming an electrically conductive redistribution layer extending from an upper surface of the electrically conductive post over an upper surface of the interlayer dielectric film.

According to another aspect of the present invention, a semiconductor device is provided. The semiconductor device includes: a wafer having a main surface on which semiconductor chip portion having an electrode are formed; an electrically conductive post formed directly above the electrode; an interlayer dielectric film having an opening positioned on the electrically conductive post and covering both the semiconductor chip portion and an edge portion of an upper surface of the electrically conductive post; and an electrically conductive redistribution layer extending from the upper surface of the electrically conductive post over an upper surface of the interlayer dielectric film.

According to the above aspects of the present invention, it is possible to prevent cracks in dielectric films formed on the electrode pads even if the wafer inspection using a probe machine is employed, resulting in good electric characteristics of the fabricated semiconductor device.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

Further scope of applicability of the present invention will become apparent from the detailed description given hereinafter. However, it should be understood that the detailed description and specific examples, while indicating preferred embodiments of the invention, are given by way of illustration only, since various changes and modifications will become apparent to those skilled in the art from the detailed description.

Figure 1:
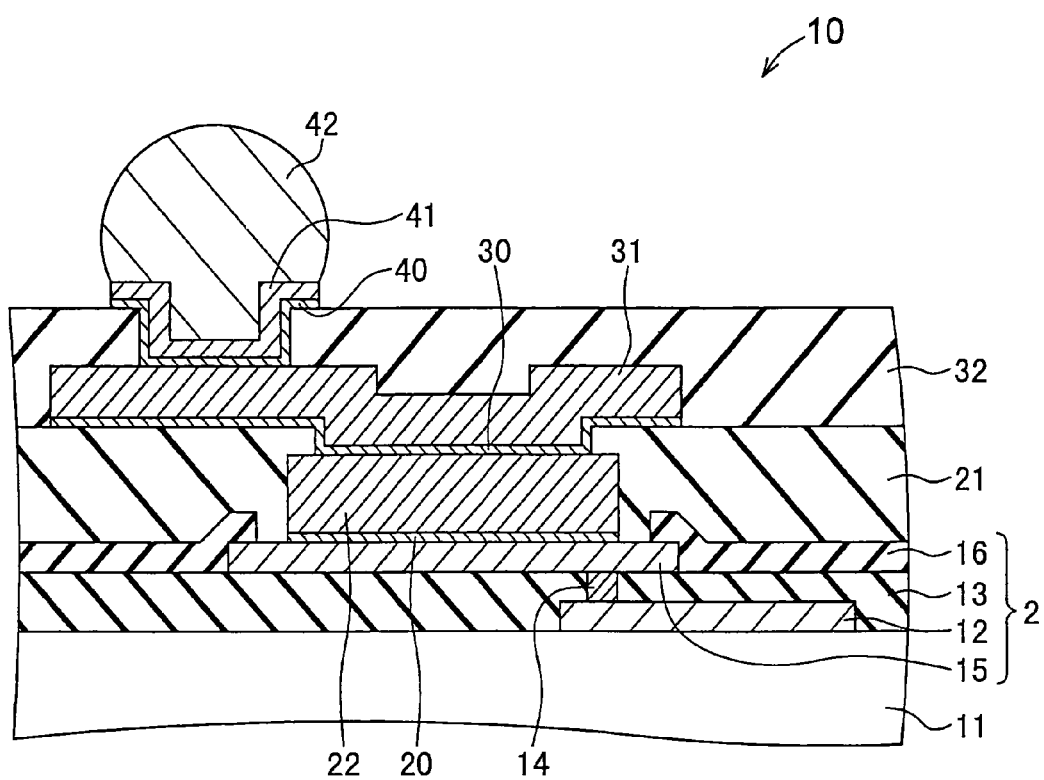
FIG. 1 is a cross-sectional view schematically illustrating an example of a semiconductor device according to an embodiment of the present invention.

FIG. 1 is a cross-sectional view schematically illustrating an example of a semiconductor device 10 according to an embodiment of the present invention. As illustrated in FIG. 1, the semiconductor device 10 includes a semiconductor substrate 11 and an upper structure formed on the semiconductor substrate 11, wherein the upper structure may include a semiconductor chip portion or portions (e.g., a semiconductor device portion such as a field-effect transistor, a capacitor, an inductor, or other devices). A typical semiconductor wafer can be used as the semiconductor substrate 11. For example, the semiconductor substrate 11 is a bulk substrate or an SOI (Silicon-On-Insulator) substrate that has a structure of a single crystalline semiconductor, a polycrystalline semiconductor, or a compound semiconductor. The semiconductor substrate 11 may include a base structure such as a resin plate, a metal plate or a glass plate.

As illustrated in FIG. 1, a lower interconnect layer 12, an interlayer dielectric film 13 covering the lower interconnect layer 12, an interlayer interconnect part (i.e., a via plug) 14 formed in the interlayer dielectric film 13, a lower electrode (i.e., an electrode pad) 15 formed on the interlayer dielectric film 13, and a passivation film 16 are formed on the semiconductor substrate 11. The lower interconnect layer 12 is electrically connected to the semiconductor chip portion 2. The lower electrode 15 is electrically connected to the lower interconnect layer 12 through the via plug 14. In the present embodiment, the semiconductor chip portion 2 includes a semiconductor element, the lower interconnect layer 12, the interlayer dielectric film 13, the via plug 14, the lower electrode 15, and the passivation film 16. The passivation film 16 is a protective layer that covers the semiconductor chip portion 2 except for a specific portion of the upper surface of the lower electrode 15, thereby protecting against chemical and, physical hazards. The lower electrode 15 is the uppermost interconnect layer of the semiconductor chip portion 2. The semiconductor chip portion 2 may be fabricated by a wafer process known in the art.

As illustrated in FIG. 1, the semiconductor device 10 further includes: a lower under-bump-metal (UBM) film 20 formed on the lower electrode 15; an electrically conductive post 22 formed on the lower UBM film 20 and electrically connected to the electrode pad 15 through the lower UBM film 20; an interlayer dielectric film 21 having an opening on the electrically conductive post 22; an upper UBM film 30 extending from the upper surface of the electrically conductive post 22 over an upper surface of the interlayer dielectric film 21; an electrically conductive redistribution layer 31 formed on the upper UBM film 30; a dielectric film 32 covering the electrically conductive redistribution layer 31 and having an opening (32n in FIG. 15); an UBM film 40 in the opening of the dielectric film 32; a barrier metal layer 41 formed on the UBM film 40; and an electrode terminal 42 formed on the UBM film 40 directly above the opening of the dielectric film 32. As illustrated in FIG. 1, the lower UBM film 20 is formed in contact with the upper surface of the lower electrode 15. The electrically conductive post 22 is formed using the lower UBM film 20 as a base seed layer (e.g., a base metal layer) and extends upwardly away from the lower UBM film 20. The electrically conductive redistribution layer 31 is formed above the electrically conductive post 22 using the upper UBM film 30 as a base seed layer (e.g., a base metal layer). The electrically conductive redistribution layer 31 is hermetically sealed by the dielectric film 32 made of resin. The UBM film 40 is formed in the opening of the dielectric film 32. The barrier metal layer 41 is formed using the UBM film 40 as a base seed layer (e.g., a base metal layer). The electrode terminal 42 for external connection is made of metal and formed on the barrier metal layer 41.

Figures 2A, 2B:
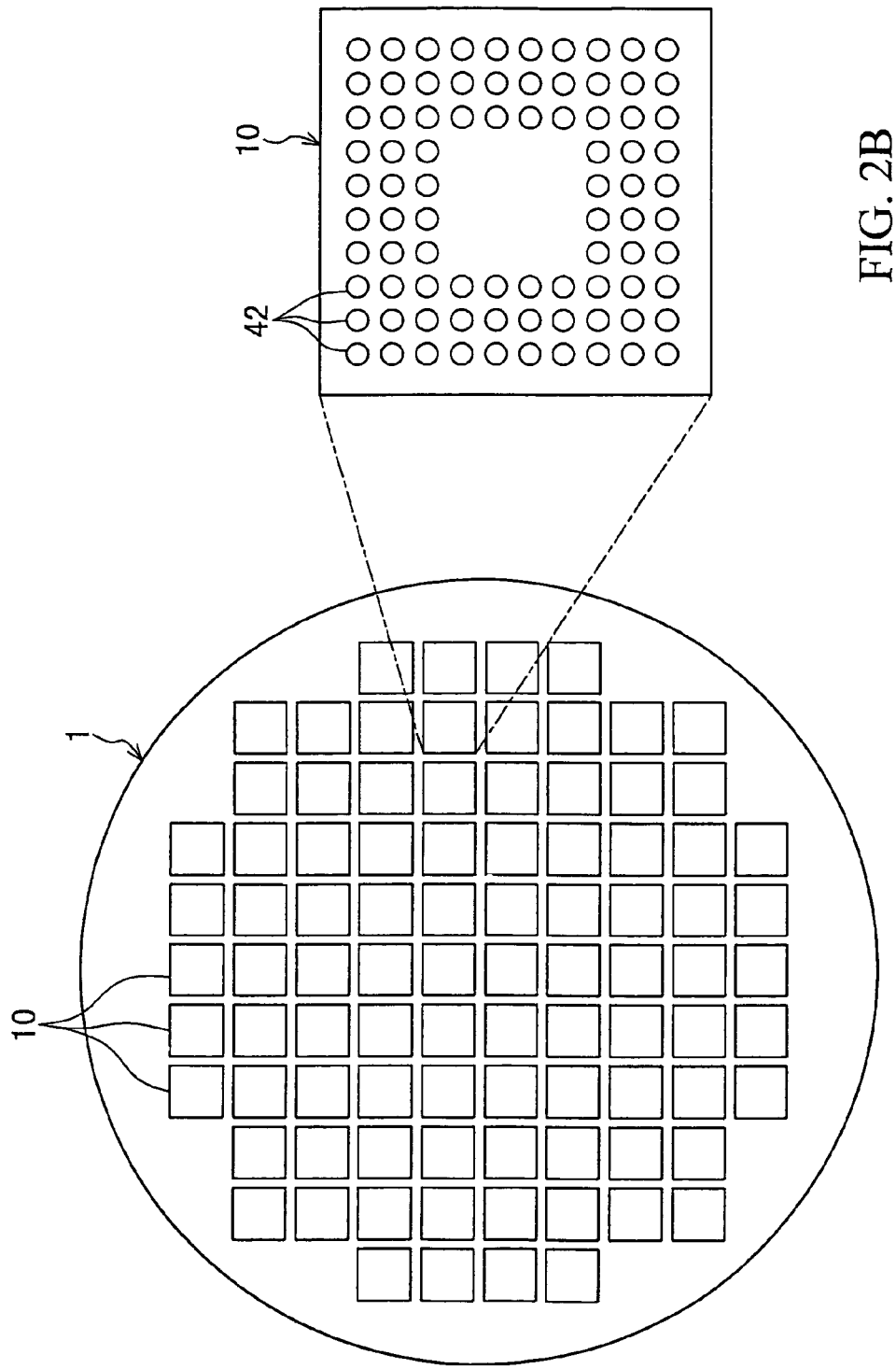
FIGS. 2A and 2B are a top view schematically illustrating a wafer having semiconductor devices and another top view schematically illustrating one of the semiconductor devices according to the embodiment respectively.

FIG. 2A is a top view schematically illustrating a wafer 1 having a main surface on which a plurality of semiconductor devices 10 (i.e., W-CSP structures) is formed, and FIG. 2B is another top view schematically illustrating one of the semiconductor devices 10 according to the present embodiment. The wafer 1 will be singulated into individual dies by a dicing process so that the semiconductor devices 10 are separated with each other. As illustrated in FIG. 2B, the electrode terminals 42 are arranged on a surface of the semiconductor device 10 with a predetermined pitch. In the packaging structure of FIG. 2B, all of the electrode terminals 42 are placed in a peripheral area of the surface of the semiconductor device 10, no limitation thereto intended. The packaging structure may be modified to have electrode terminals over the entire surface of the semiconductor device 10.

A method of fabricating the semiconductor device 10 according to the present embodiment will be described with reference to the drawings. FIG. 3 to FIG. 19 are cross-sectional views schematically illustrating semiconductor structures at fabrication steps for the semiconductor device 10 according to the present embodiment.

Figure 3:
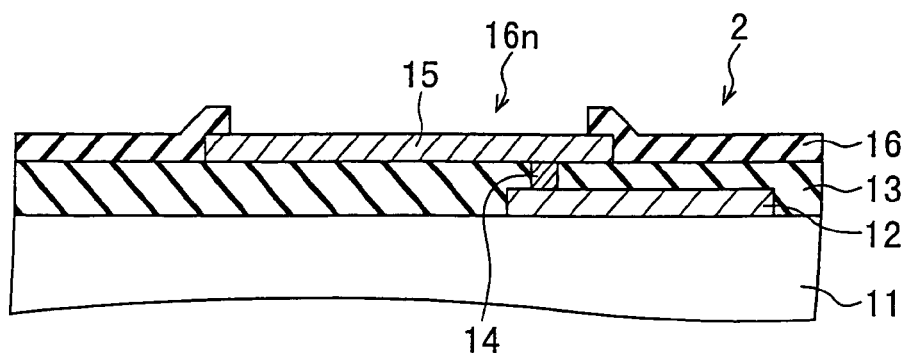
FIG. 3 to FIG. 19 are cross-sectional views schematically illustrating semiconductor structures at fabrication steps for the semiconductor device according to the embodiment.

First, as illustrated in FIG. 3, a semiconductor chip portion 2 is fabricated on the semiconductor substrate 11 by a typical wafer process. More specifically, a semiconductor element such as a field effect transistor or other devices (not illustrated) are formed on the semiconductor substrate 11, and thereafter a pattern of the lower interconnect layer 12 that is electrically connected to the semiconductor element are formed. After that, a dielectric material such as silicon oxide is deposited on the lower interconnect layer 12 to form a dielectric film by a chemical vapor deposition (CVD) method or the like, for example. Next, a contact hole is formed in the dielectric film 13 on an upper layer of the lower interconnect layer 12 so as to expose an upper surface of the lower interconnect layer 12 by a photolithography process or the like, and the contact hole is filled with electrically conductive material by a CVD method or the like, for example. Upper surfaces of the dielectric film and the electrically conductive material are flattened, thereby forming the interlayer dielectric film 13 and the via plug 14. Next, an electrically conductive layer such as an aluminum layer is formed on the interlayer dielectric film 13 by a sputtering method, a CVD method or the like, for example, and patterning of the electrically conductive layer is performed, thereby forming the lower electrode 15 electrically connecting through the via plug 14 to the lower interconnect layer 12. Furthermore, a dielectric film such as a polyimide resin is formed on the lower electrode 15 and the interlayer dielectric film 13, and patterning of the dielectric film is performed by a photolithography process or the like, thereby forming the passivation film 16 having an opening 16n, by which a part of an upper surface of the lower electrode 15 is exposed.

After the above wafer process, a wafer inspection (probe test) is performed using a probe needle or needles in a probe machine. Specifically, a tip of the probe needle (not illustrated) is brought in contact with an exposed surface of the lower electrode 15 and electric characteristic of the semiconductor chip portion 2 is measured, thereby determining whether a semiconductor chip portion 2 (semiconductor element) is good or bad. At this time, a tip of the probe needle may shave the lower electrode 15, form a contact trace (i.e., a probe mark) on a surface of the lower electrode 15, and leave a residue as a scum of shaving in the vicinity of a surface of the lower electrode 15. Furthermore, a residue may be introduced from outside by a tip of the probe needle to be left on the lower electrode 15.

Figure 4:
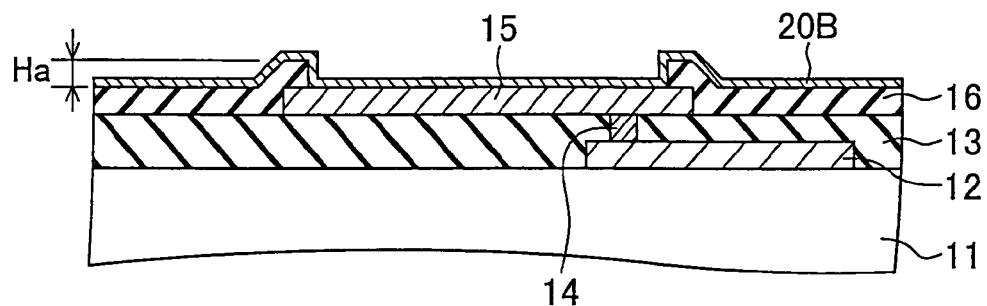

After the wafer inspection, as illustrated in FIG. 4, an electrically conductive material is deposited over a surface of the lower electrode 15 and the passivation film 16 by a sputtering method, a vacuum deposition method or the like, for example, thereby forming a UMB film 20B having a thickness of approximately 0.5 to 1 micrometers. The UMB film 20B is a film including a metal film or an alloy film. The metal film is made of, for example, titanium (Ti), chromium (Cr), tungsten (W), gold (Au), copper (Cu) or the like. The alloy film includes, for example, two or more kinds of metals such as Ti, Cr, W, Au, Cu or the like. Further, the UMB film 20B is preferably a laminated film such as a Cu/Ti laminated film. However, the UMB film 20B may be a single layer film.

Figure 5:
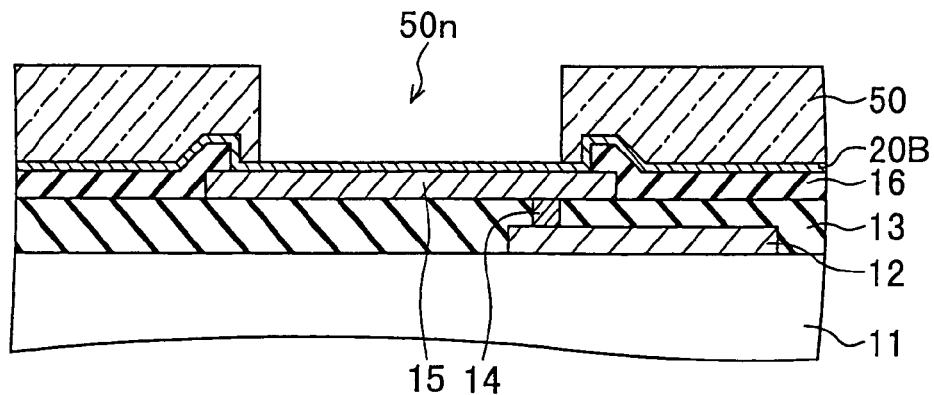

Next, as illustrated in FIG. 5, a resist film (a first resist pattern) 50 is formed so as to have an opening 50n positioned directly above the lower electrode 15.

Figure 6:
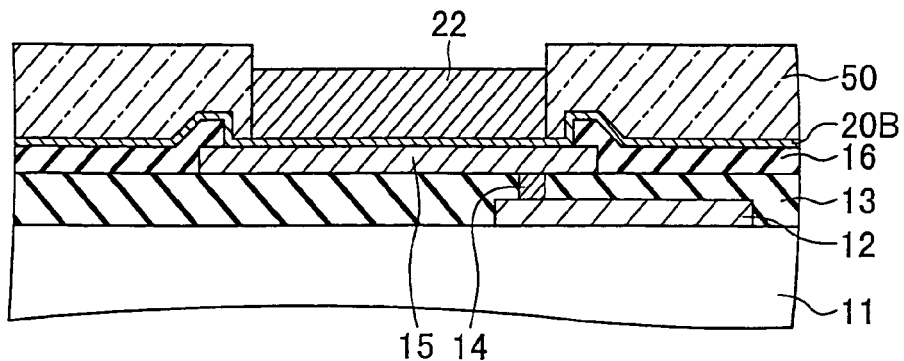

Next, as illustrated in FIG. 6, an electrically conductive post 22 is formed in the opening 50n using the UMB film 20B exposed in the opening 50n as a base seed layer by an electroplating method so as to have a thickness (e.g., a thickness of approximately 3 to 10 micrometers) which is thinner than that of the resist film 50. The electrically conductive post 22 is made of, for example, copper plating film.

Figure 7:
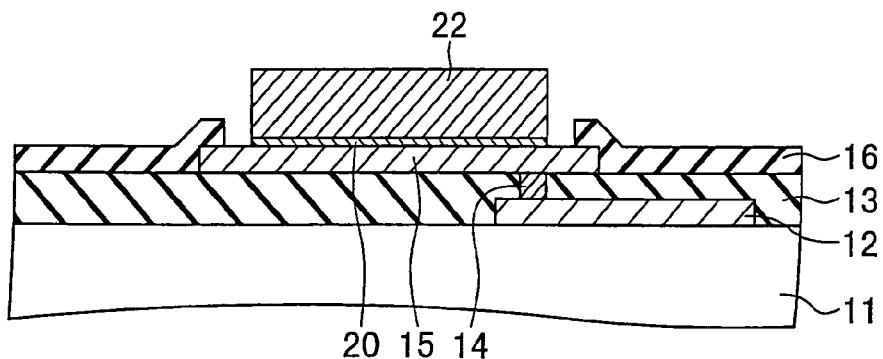

Next, as illustrated in FIG. 7, the resist film 50 is removed by an ashing treatment or the like and an exposed portion of the UMB film 20B is removed using the electrically conductive post 22 as an etching blocking film by wet etching or the like. As a result, the electrically conductive post 22 stands on the lower electrode 15, thereby forming a UMB film 20 interposing between a bottom surface of the electrically conductive post 22 and the upper surface of the lower electrode 15.

Figure 8:
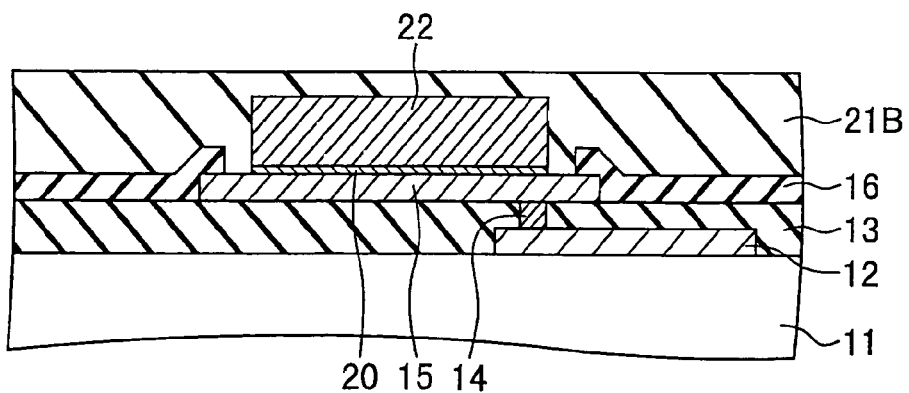

Next, as illustrated in FIG. 8, for example, a photosensitive resin material is coated over the wafer by a spin coating method, a printing method or the like, thereby forming a coated film 21B covering the electrically conductive post 22 and the passivation film 16. A precursor such as a polyimide material or a PBO (poly-benzoxazole) material having a comparatively high curing temperature may be used as a photosensitive resin material.

Figure 9:
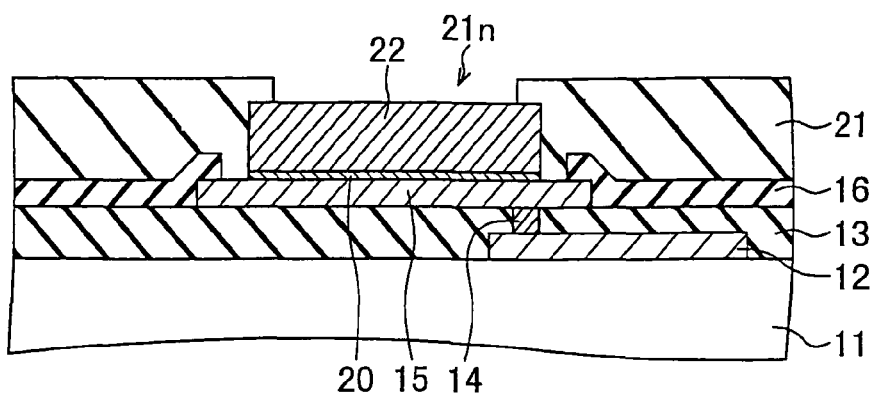

Next, as illustrated in FIG. 9, the coated film 21B is exposed to light for patterning, and the patterned dielectric film is subject to a heat treatment (e.g., a curing process) in an atmosphere of an inert gas, thereby hardening the coated film. Subsequently, a descumming treatment is performed to remove a residue (e.g., a scum) of the resist. As a result, an interlayer dielectric film 21 having an opening 21n in which a part of the upper surface of the electrically conductive post 22 is exposed. The interlayer dielectric film 21 covers an edge of the upper surface of the electrically conductive post 22. It is preferable that a thickness of the interlayer dielectric film 21 be larger than a sum total of thicknesses of the UMB film 20 and the electrically conductive post 22 and be approximately 5 to 15 micrometers, for example.

Figure 10:
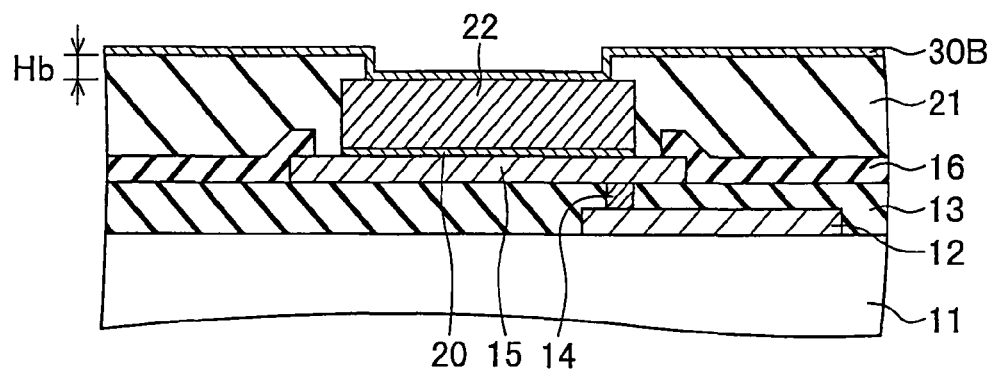

Subsequently, as illustrated in FIG. 10, an electrically conductive material is deposited on a surface of the electrically conductive post 22 and the interlayer dielectric film 21 by sputtering method, a vacuum deposition method or the like, thereby forming a UMB film 30B having a thickness of approximately 0.5 to 1 micrometers, for example. The UMB film 30B is a film including a metal film or an alloy film. The metal film is, for example, Ti, Cr, W, Au, Cu or the like. The alloy film includes, for example, two or more kinds of metals such as Ti, Cr, W, Au, Cu or the like. Although the UMB film 30B is preferably a laminated film, it may be a single layer film.

Figure 11:
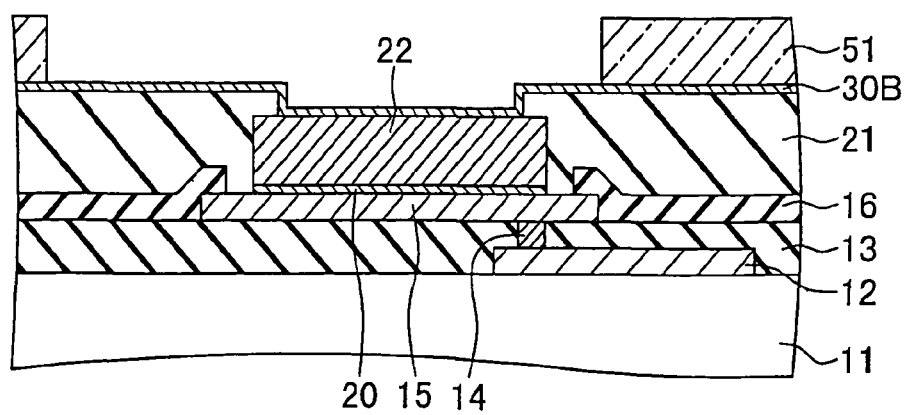

Next, as illustrated in FIG. 11, a resist film (a second resist pattern) 51 having an opening 51n is formed directly above the electrically conductive post 22.

Figure 12:
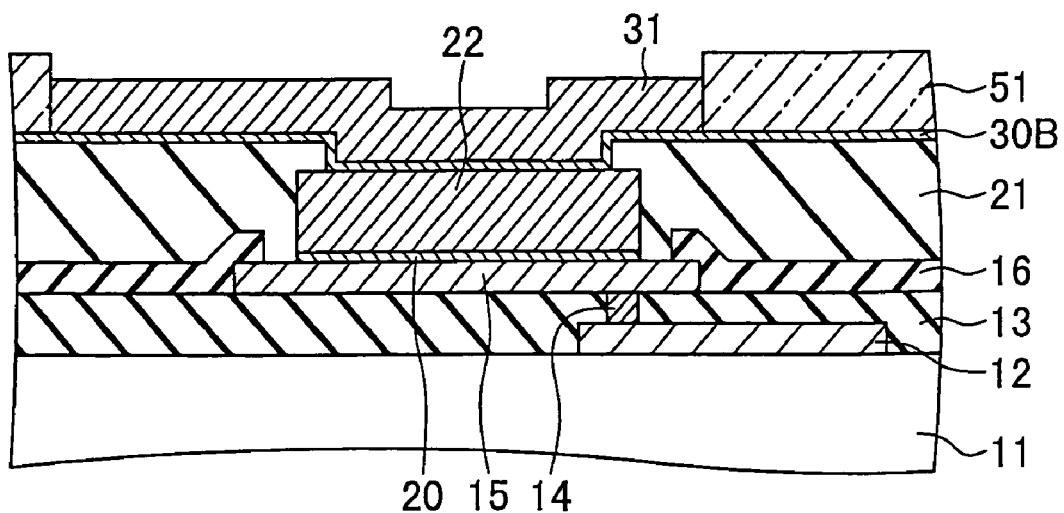

Next, as illustrated in FIG. 12, the electrically conductive redistribution layer 31 is formed by an electroplating method using the UMB film 30B exposed to the opening 51n as a base seed layer or other methods. The electrically conductive redistribution layer 31 may be formed by a copper plating film, for example.

Figure 13:
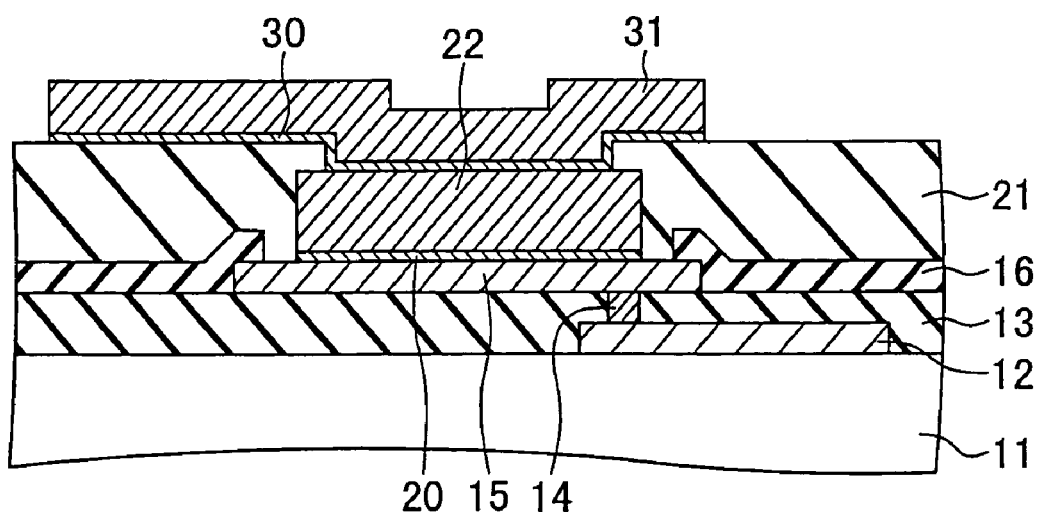

Subsequently, as illustrated in FIG. 13, the resist film 51 is removed by an ashing treatment and an exposed part of the UMB film 30 is removed by wet etching using the electrically conductive redistribution layer 31 as an etching blocking film. As a result, patterns of the UMB film 30 and the electrically conductive redistribution layer 31 are formed.

Figure 14:
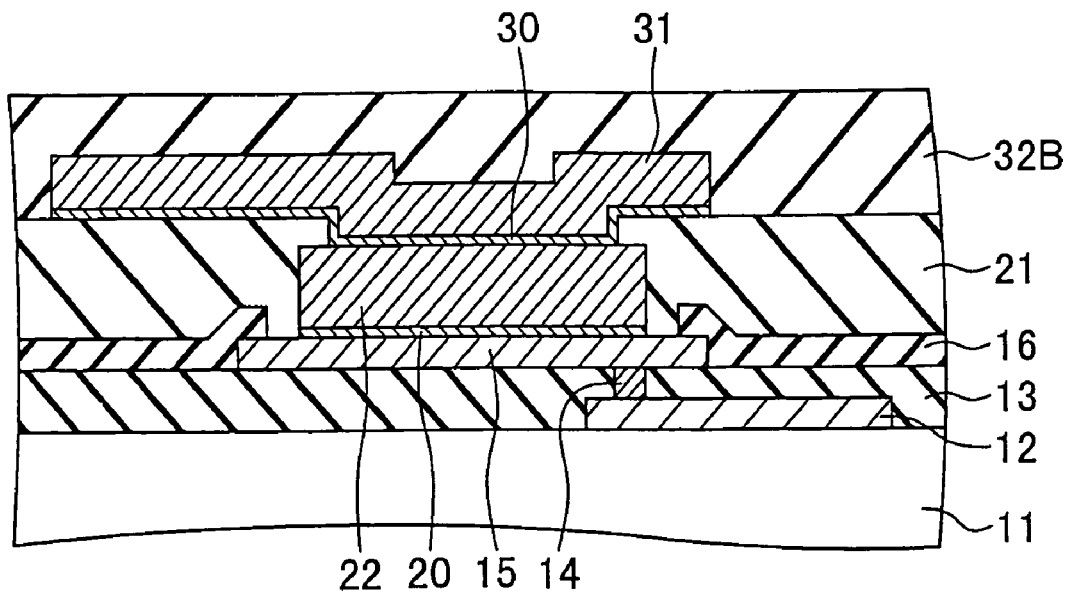

Next, as illustrated in FIG. 14, a resin material is coated over the wafer by a spin coating method, a printing method or the like, thereby forming a dielectric film 32B covering the interlayer dielectric film 21 and the electrically conductive redistribution layer 31.

Figure 15:
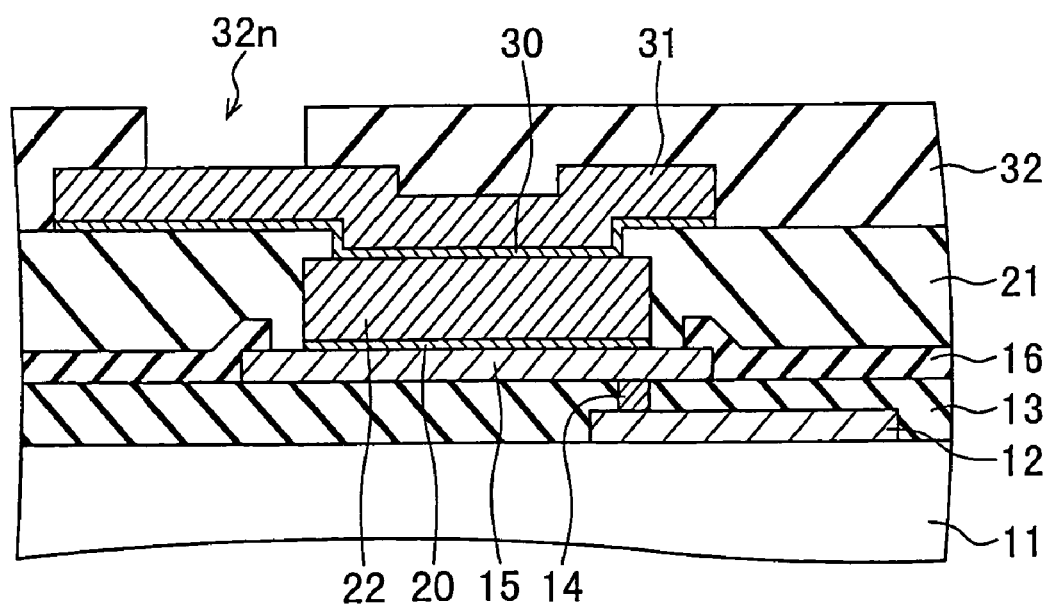

Subsequently, as illustrated in FIG. 15, the patterning process of the dielectric film 32B is performed, thereby forming an upper dielectric film 32 having the opening 32n in which a part of an upper surface of the electrically conductive redistribution layer 31 is exposed.

Figure 16:
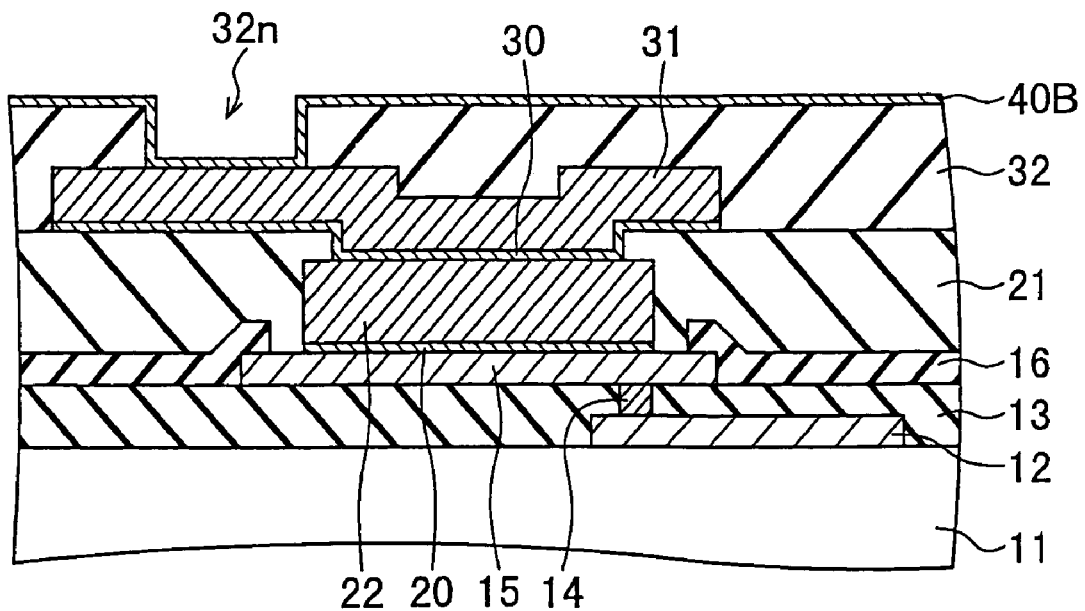

Subsequently, as illustrated in FIG. 16, an electrically conductive material is deposited on a surface of the electrically conductive redistribution layer 31 and the upper dielectric film 32a by a sputtering method, a vacuum deposition method or the like, thereby forming a UMB film 40B. The UMB film 40B is a film including a metal film or an alloy film. The metal film is for example, Ti, Cr, W, Au, Cu or the like. The alloy film includes, for example, two or more kinds of metals such as Ti, Cr, W, Au, Cu or the like. Although the UMB film 40B is preferably a laminated film, it may be a single layer film.

Figure 17:
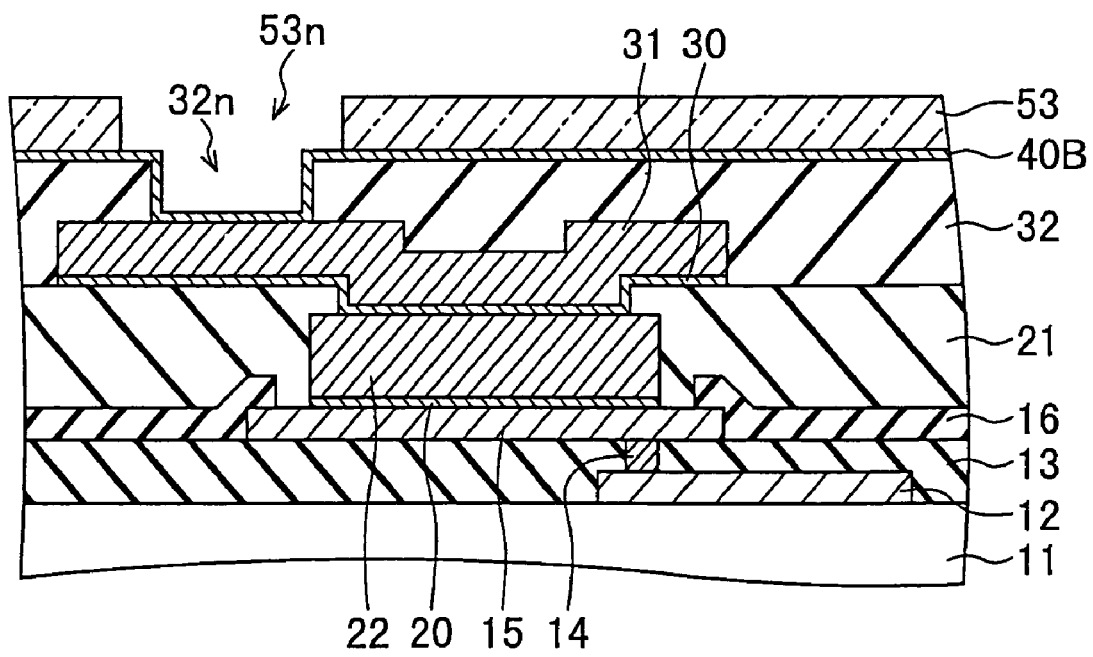

Next, as illustrated in FIG. 17, a resist film (the third resist pattern) 53 having an opening 53n which is connected to the opening 32n.

Figure 18:
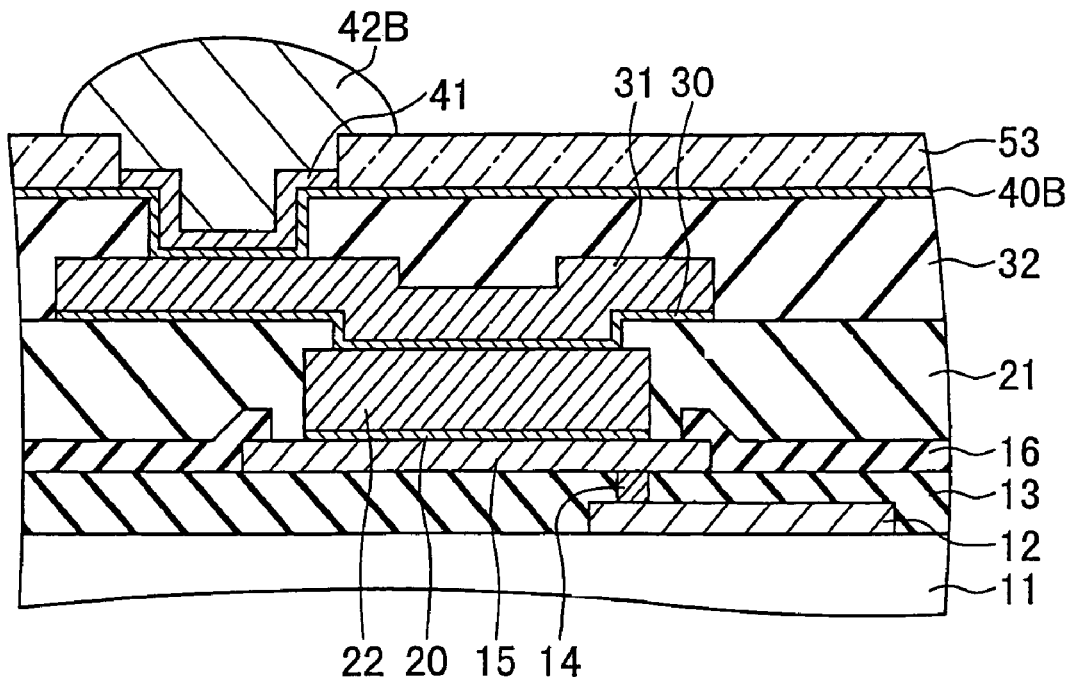

Next, as illustrated in FIG. 18, a barrier metal 41 is formed by a plating method such as an electroplating method, using the UMB film 40B exposed in the openings 32n and 53n as a base seed layer and a metal terminal material 42B is bonded to the barrier metal 41. The metal terminal material 42B is, for example, a solder ball bump.

Figure 19:
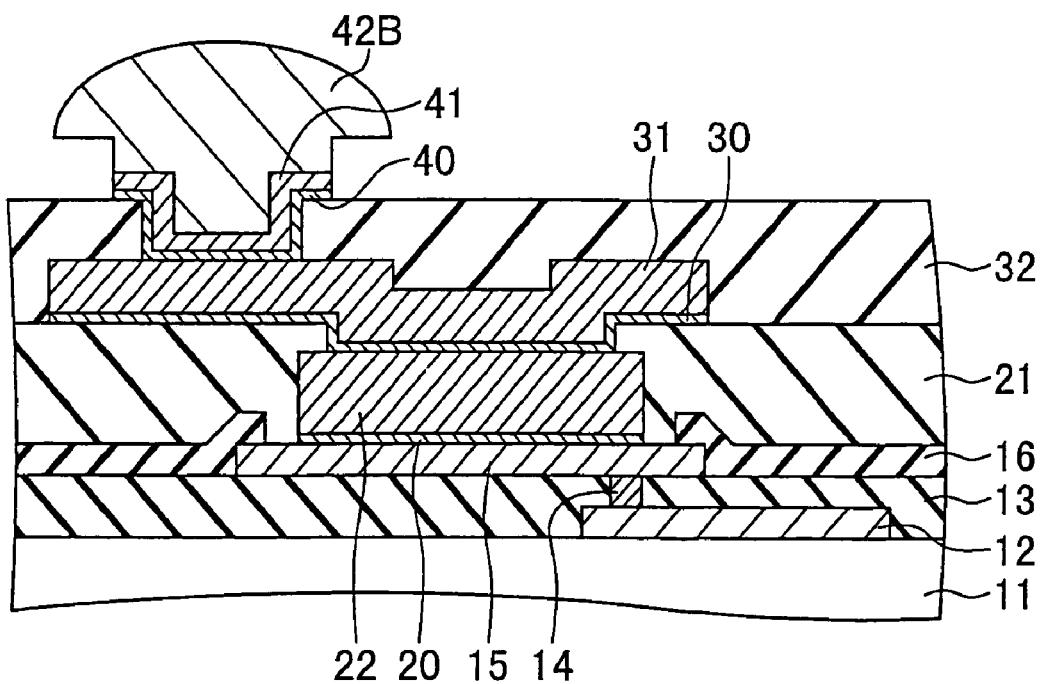

Subsequently, as illustrated in FIG. 19, the resist film 53 is removed by an ashing treatment and an exposed part of the UBM film 40B is removed by an etching process using the barrier metal 41 and the metal terminal material 42B as an etching blocking film. As a result, a structure including the UMB film 40, the barrier metal 41 and the metal terminal material 42B is formed. The metal terminal material 42B is fused using a reflow oven, and a semiconductor device 10 having a metal terminal 42 is completed as illustrated in FIG. 1.

As has been described above, a residue may be left in the vicinity of the upper surface of the lower electrode 15 by bringing the probe needle in a probe machine in contact with the lower electrode 15 during a wafer inspection after the wafer process. In the fabricating method according to the present embodiment, even if the residue is generated, the residue can be buried inside the electrically conductive post 22 formed at steps of FIG. 6 and FIG. 7 so as not to expose the residue, or, the residue can be buried inside the interlayer dielectric film 21 formed at steps of FIG. 8 and FIG. 9 so as not to expose the residue, or, the residue can be buried inside the electrically conductive post 22 and the interlayer dielectric film 21 so as not to expose the residue. When the interlayer dielectric film 21 is formed by a heat treatment (e.g., a curing process) of the coated film, since the residue generated in a wafer inspection is embedded in the coated film, or the electrically conductive post 22, or both of them, a thermal stress due to a difference in thermal expansion coefficients between the resin component of the coated film and a residue can be suppressed. It is conceivable that the above description is a reason why occurrence of a defect (e.g., a crack) of the interlayer dielectric film 21 due to a residue can be prevented in the present embodiment. Accordingly, using the method of fabricating a semiconductor device according to the present embodiment, a semiconductor device 10 having high electric characteristic can be fabricated and a reduction of a yield can be prevented.

Further, in the method of fabricating the semiconductor device 10 according to the present embodiment, at the step of FIG. 4, the UMB film 20B is formed so as to be in contact with both the passivation film 16 and the lower electrode 15, a difference Ha in level between the passivation film 16 and the lower electrode 15 is small (e.g., approximately 1 micrometer at the maximum). The UMB film 20B can have a high sealing performance for the lower electrode 15. As will be described below, in the conventional fabricating method, a UMB film is formed on an area having a large difference in level between the interlayer dielectric film and the lower electrode 15 after the interlayer dielectric film is formed on the passivation film 16. For this reason, a sealing performance of the UMB film is low. Accordingly, when a metal plating film is formed using the UMB film as a base seed layer, the plating solution erodes (or etches) the lower electrode 15 in some cases.

In contrast, in the present embodiment, a difference Ha in level between the passivation film 16 and the lower electrode 15 is small, and when an electrically conductive post 22 is formed using the UMB film 20B as a base seed layer, the UMB film 20B has a function as a blocking film against the plating solution. As a result, damage due to etching by the lower electrode 15 can be suppressed.

Furthermore, at the step of FIG. 10, a UMB film 30B is formed on the electrically conductive post 22. A difference Hb in level between the electrically conductive post 22 and the interlayer dielectric film 21 can be reduced by adjusting a height of the electrically conductive post 22. Therefore, when an electrically conductive redistribution layer 31 is formed on the UMB film 30B as shown in FIG. 12, the UMB film 30B functions as a protective film or a blocking film against the plating solution, etching damage by the electrically conductive post 22 can be reduced.

Next, a comparative example of the method of fabricating a semiconductor device will be described. FIG. 20 to FIG. 26 are cross-sectional views schematically illustrating semiconductor structures at fabrication steps for a comparative example of a semiconductor device.

Figure 20:
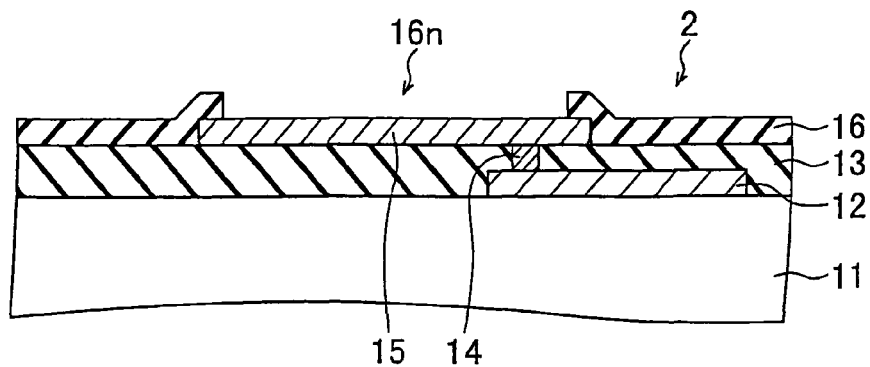
FIG. 20 to FIG. 26 are cross-sectional views schematically illustrating semiconductor structures at fabrication steps for a comparative example of a semiconductor device.

First, in a similar manner to the fabricating method of the present embodiment, in the comparative example, as illustrated in FIG. 20, a semiconductor chip portion 2 is formed on the upper surface of a semiconductor substrate 11 by a wafer process. After the wafer process, a wafer inspection is performed by bringing a probe needle (i.e., a prober) in contact with an exposed surface of the lower electrode 15. Subsequently, a coated film is formed by coating a photosensitive resin material over the lower electrode 15 and the passivation film 16, patterning is performed by irradiating the coated film with light, the coated film after patterning is subjected to a heat treatment (e.g., a curing process) to be hardened, and a descumming treatment is performed.

Figure 21:
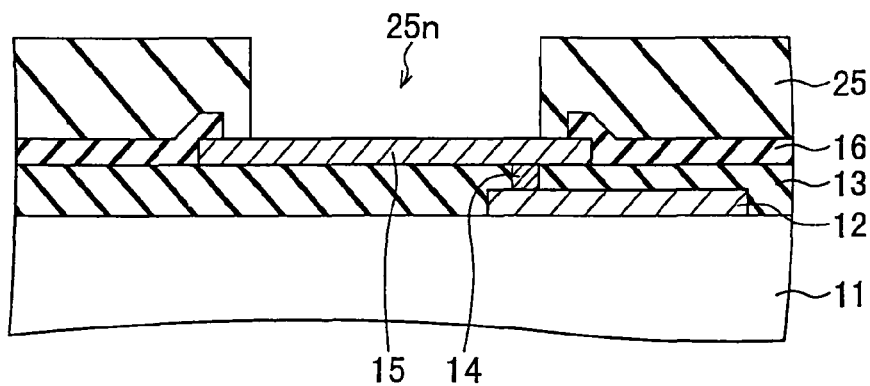

As a result, as illustrated in FIG. 21, an interlayer dielectric film 25 having an opening 25n is formed over the lower electrode 15 and the passivation film 16.

Figure 22:
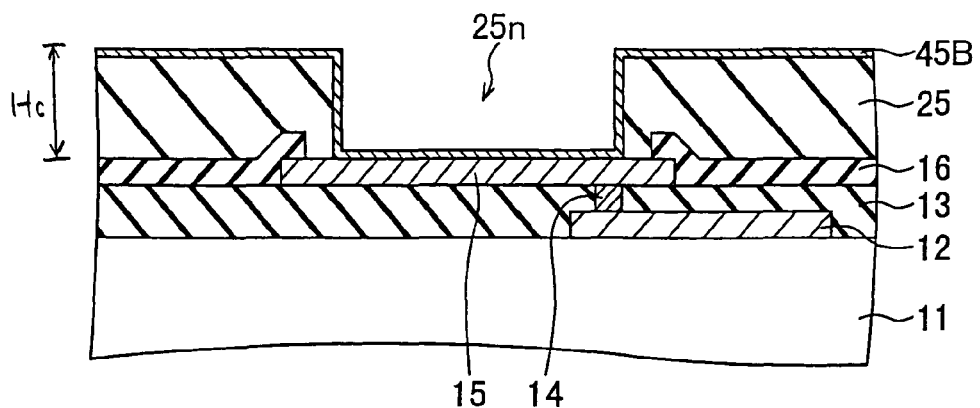

Next, as illustrated in FIG. 22, an electrically conductive material is deposited on a surface of the lower electrode 15 and the interlayer dielectric film 25 by a sputtering method, thereby forming a UMB film 45B.

Figure 23:
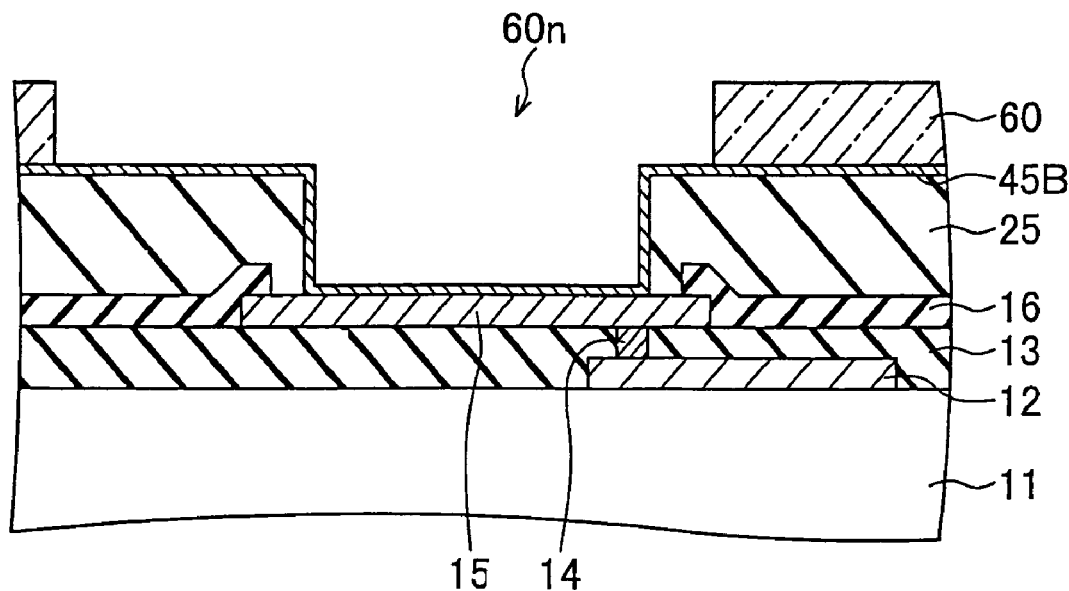

Next, as illustrated in FIG. 23, a resist film 60 having an opening 60n is formed.

Figure 24:
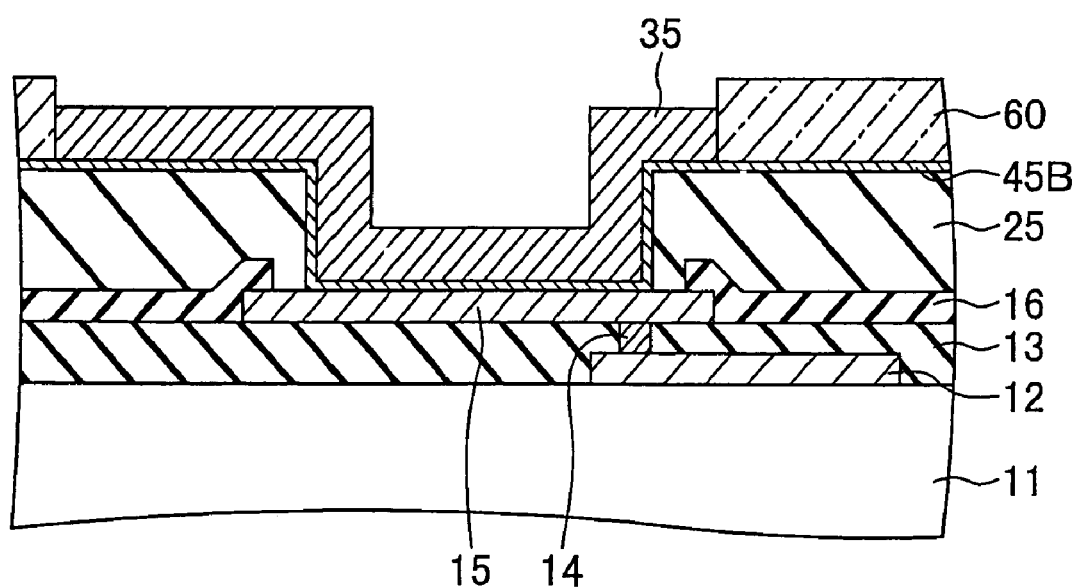

Next, as illustrated in FIG. 24, an electrically conductive redistribution layer 35 is formed on a UMB film 45B exposed in the opening 60n by an electroplating method using the UMB film 45B as a base seed layer.

Figure 25:
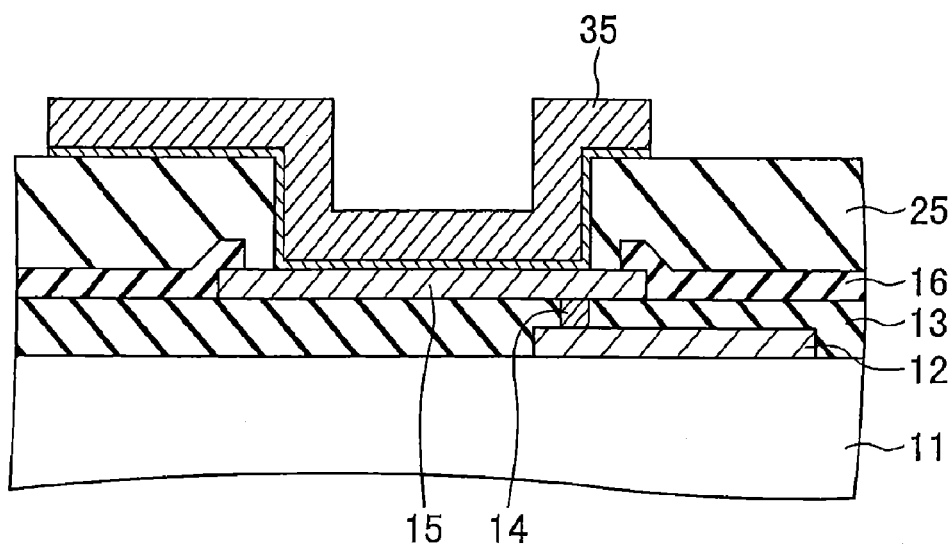

Next, as illustrated in FIG. 25, the resist film 60 is removed by an ashing treatment and an exposed part of the UMB film 20B is removed using an electrically conductive post 22 as an etching blocking film.

Figure 26:
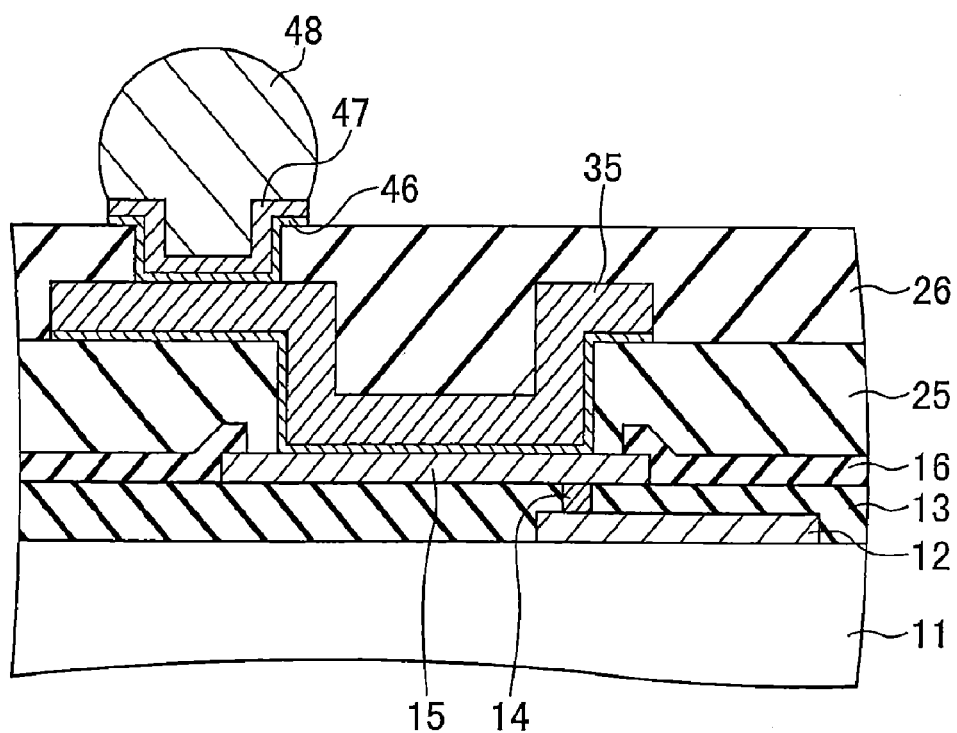

Thereafter, as illustrated in FIG. 26, an interlayer dielectric film 26, a UMB film 46, a barrier metal 47 and a terminal metal 48 are formed on the electrically conductive redistribution layer 35.

As has been described above, a residue may be generated because a probe needle is brought in contact with the lower electrode 15 after a wafer process during the wafer inspection. In the comparative example, at the step of FIG. 21, the coated film after patterning is hardened by the heat treatment, thereby forming the interlayer dielectric film 25. In some cases, a residue having a smaller thermal expansion coefficient than that of the coated film is embedded in the coated film after patterning and partially exposed to outside of the coated film. If in this state, the coated film is subject to the heat treatment and the descumming treatment, a large thermal stress occurs due to a difference in the thermal expansion coefficients between the resin component of the coated film and the residue. This causes the interlayer dielectric film 25 a defect such as a crack. Especially, if the residue is a scum of the lower electrode 15, there is a large difference of the thermal expansion coefficients between the residue and the resin component of the coated film, a defect is apt to be generated in the interlayer dielectric film 25.

Figure 27A:
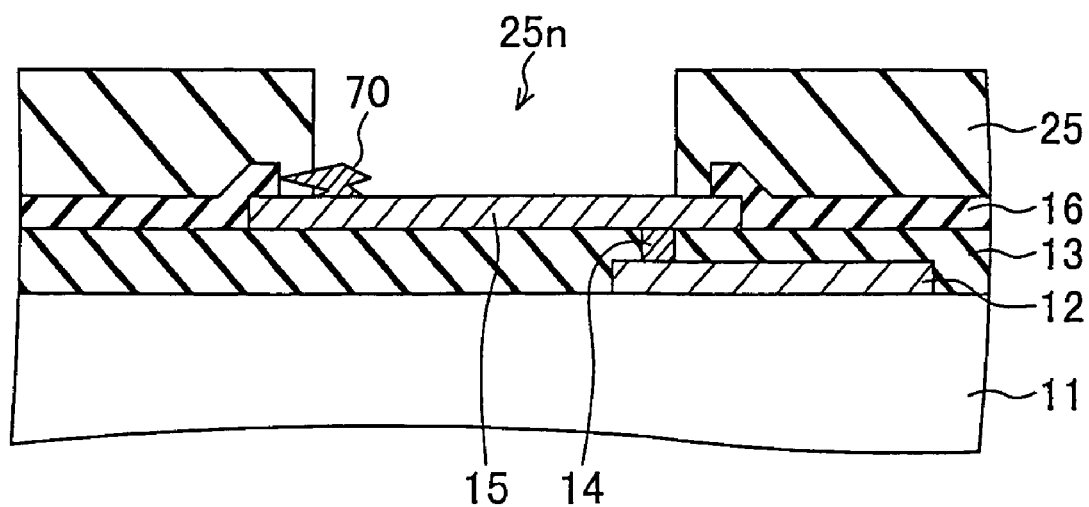
FIG. 27A is a cross-sectional view schematically illustrating semiconductor structures that include a residue caused by a wafer inspection using a probe machine in the comparative example of the semiconductor device.
Figure 27B:
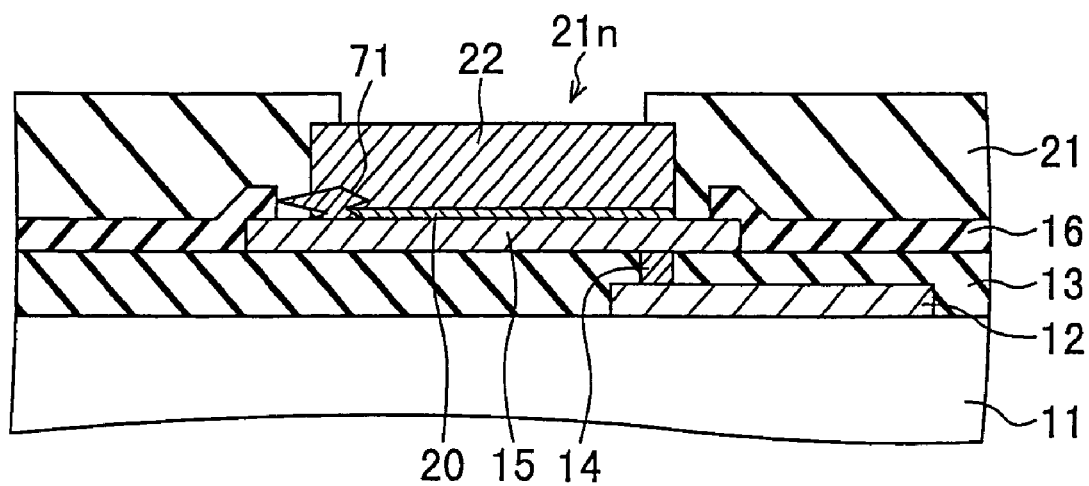
FIG. 27B is a cross-sectional view schematically illustrating semiconductor structures that include a residue caused by a wafer inspection using a probe machine in the present embodiment.

FIG. 27A is a cross-sectional view schematically illustrating semiconductor structures that include a residue 70 caused by a wafer inspection using a probe machine in the comparative example of the semiconductor device, and FIG. 27B is a cross-sectional view schematically illustrating semiconductor structures that include a residue 71 caused by a wafer inspection using a probe machine in the present embodiment. As illustrated in FIG. 27A, a defect such as a crack is apt to occur at a starting point of a position of the embedded residue 70. This type of defect gives rise to a short-circuit, thereby degrading electric characteristic of the semiconductor device.

In contrast to this, in the fabricating method according to the present embodiment, a residue 71 generated during the wafer inspection can be embedded in the following manners:
(1) referring to FIG. 6, FIG. 7 and FIG. 27B, the residue 71 is embedded inside the electrically conductive post 22 formed at the steps of FIG. 6 and FIG. 7 so as not to be exposed;
(2) referring to FIG. 8, FIG. 9 and FIG. 27B, the residue 71 is embedded inside the interlayer dielectric film 21 formed at the steps of FIG. 8 and FIG. 9 so as not to be exposed; or
(3) referring to FIG. 27B, the residue 71 is embedded inside the electrically conductive post 22 and the interlayer dielectric film 21 so as not to be exposed.

The coated film after patterning is hardened by the heat treatment. When the interlayer dielectric film 21 is formed, even if the residue 71 is embedded by the coated film, the residue 71 is not exposed to the outside, a thermal stress occurring due to a difference in thermal expansion coefficients between the resin component of the coated film and the residue 71 can be suppressed. Therefore, occurrence of a defect such as a crack in the interlayer dielectric film 21 can be prevented. Accordingly, even if a residue is left in the vicinity of the surface of the lower electrode 15a due to the wafer inspection, the deterioration of electric characteristic and a reduction of a yield can be prevented.

Figure 28:
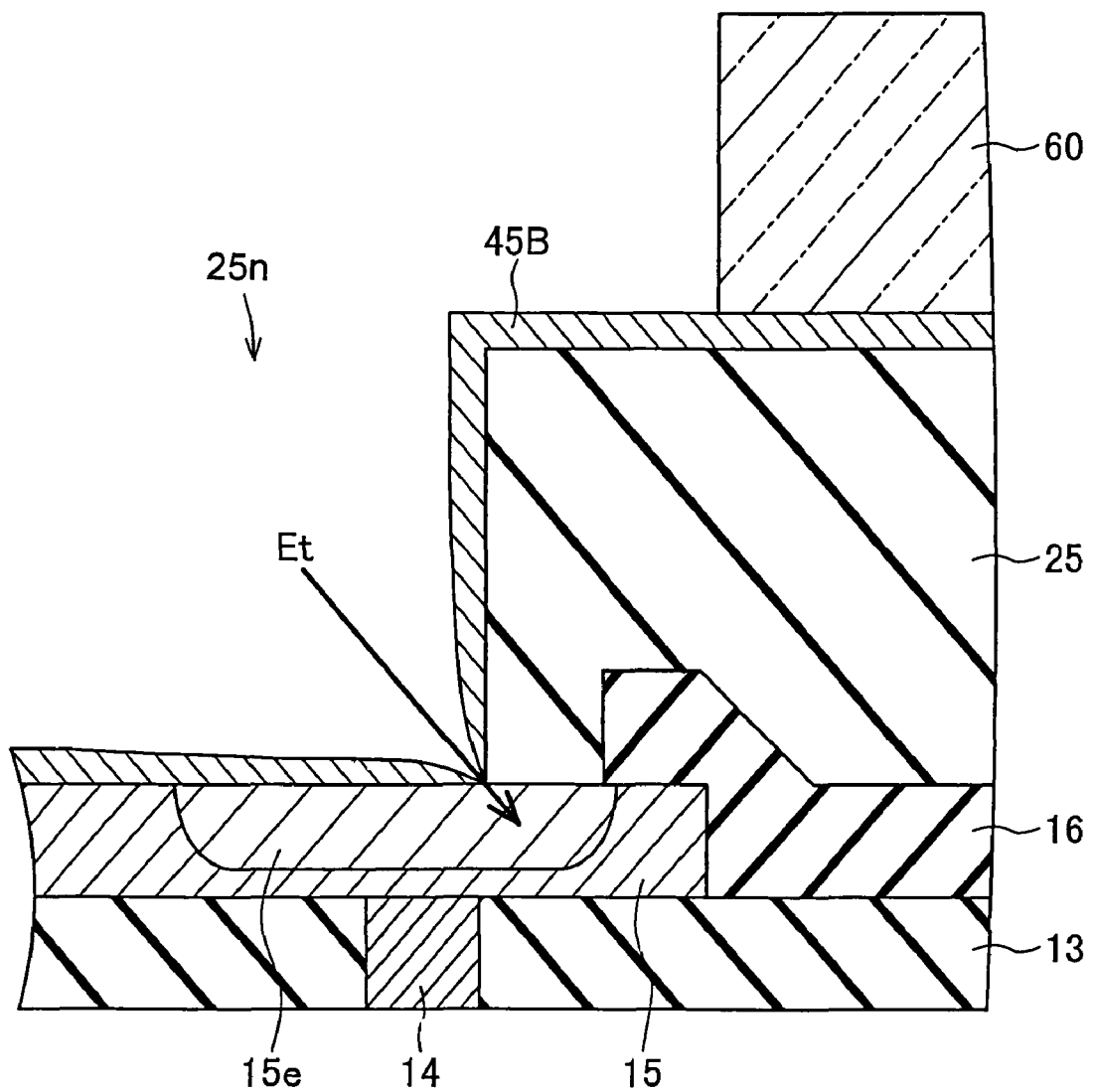
FIG. 28 is an enlarged cross-sectional view schematically illustrating a semiconductor structure for explaining a problem in the fabrication step of the comparative example of the semiconductor device.

Further, in the comparative example, as illustrated in FIG. 22, after the wafer process, the interlayer dielectric film 25 is formed on the wafer, and then the UMB film 45B is formed in the opening 25n of the interlayer dielectric film 25. Since a film thickness of the interlayer dielectric film 25 is generally approximately 5 to 10 micrometers, there is a large difference Hc in level between the interlayer dielectric film 25 and the lower electrode 15. In this case, as illustrated in FIG. 28, a film thickness of the UMB film 45B may be thinned at the bottom of the opening 25n near the side wall of the interlayer dielectric film 25, thereby reducing sealing performance of the UMB film 45B against the plating solution. Since the plating solution for electroplating has generally a performance for resolving metals, there is a problem that the plating solution (i.e., etchant) Et penetrates the side wall near the bottom of the interlayer dielectric and erodes an area 15e under the UMB film 45B.

In contrast to this, in the present embodiment, as illustrated in FIG. 4, since the difference Ha in level between the passivation film 16 and the lower electrode 15 is small, the UMB film 20B can have a high sealing performance against a plating solution.

Further, as illustrated in FIG. 10, by adjusting a height of the electrically conductive post 22, the difference Hb in level between the electrically conductive post 22 and the interlayer dielectric film 21 can be reduced. Therefore, the UMB film 30B can have a high sealing performance against a plating solution.

The invention being thus described, it will be obvious that the same may be varied in many ways. Such variations are not to be regarded as a departure from the spirit and scope of the invention, and all such modifications as would be obvious to one skilled in the art are intended to be included within the scope of following claims.

What is claimed is:

1. A method of fabricating a semiconductor device comprising:
   forming a semiconductor chip portion having an electrode on a main surface of a wafer;
   forming a passivation film covering the semiconductor chip portion, the passivation film having an opening exposing an upper surface of the electrode;
   forming a lower base seed layer on the semiconductor chip portion, the lower base seed layer being in contact with both an upper surface of the passivation film and the upper surface of the electrode;
   forming a first resist pattern having a first opening on the electrode after the lower base seed layer is formed;
   filling the first opening with a first electrically conductive material, thereby forming an electrically conductive post;
   removing the first resist pattern after said forming of the electrically conductive post;
   forming an interlayer dielectric film having a second opening positioned on the electrically conductive post; and
   forming an electrically conductive layer extending from an upper surface of the electrically conductive post over an upper surface of the interlayer dielectric film.

2. The method according to claim 1, further comprising:
   forming a base seed layer on the upper surface of the electrically conductive post and the upper surface of the interlayer dielectric film before said forming of the electrically conductive layer,
   said forming of the electrically conductive layer being performed by forming the electrically conductive layer on the base seed layer.

3. The method according to claim 2, wherein said forming of the electrically conductive layer includes:
   forming a second resist pattern on the base seed layer, the second resist pattern having a third opening positioned in an area directly above the upper surface of the electrically conductive post;
   filling the third opening of the second resist pattern with a second electrically conductive material, thereby forming the electrically conductive layer;
   removing the second resist pattern after said forming of the electrically conductive layer; and
   selectively removing the base seed layer using the electrically conductive layer as a mask after said removing of the second resist pattern.

4. The method according to claim 1, wherein said forming of the interlayer dielectric film includes:
   coating a dielectric film material over the semiconductor chip portion; and
   heating the coated dielectric film material.

5. The method according to claim 1, further comprising bringing a probe needle of a probe machine in contact with an exposed surface of the electrode, and measuring electric characteristics of the semiconductor chip portion through the probe needle before said forming of the first resist pattern.

6. The method according to claim 1, further comprising selectively removing the lower base seed layer using the electrically conductive post as a mask after said removing of the first resist pattern.

7. The method according to claim 1, further comprising forming an electrode terminal on the electrically conductive layer, through which the electrode terminal is electrically connected to the electrode.

8. A semiconductor device comprising:
   a wafer having a main surface on which a semiconductor chip portion having an electrode is formed;
   a passivation film covering the semiconductor chip portion except for a portion of an upper surface of the electrode;
   a lower base seed layer for electroplating formed only on the upper surface of the electrode;
   an electrically conductive post formed by electroplating using the lower base seed layer directly above the electrode, the electrically conductive post being located only on an upper surface of the lower base seed layer;
   an interlayer dielectric film having an opening positioned on the electrically conductive post and covering both the semiconductor chip portion and an edge portion of an upper surface of the electrically conductive post; and
   an electrically conductive layer extending from the upper surface of the electrically conductive post over an upper surface of the interlayer dielectric film.

9. The semiconductor device according to claim 8, wherein an upper surface of the electrode has a probe mark formed by a probe needle of a probe machine.

10. The semiconductor device according to claim 9, further comprising a residue that is embedded in either or both of the interlayer dielectric film and the electrically conductive post and has a thermal expansion coefficient smaller than that of the interlayer dielectric film, the residue being generated by bringing the probe needle in contact with the upper surface of the electrode.

* * * * *